United States Patent
Narita et al.

(10) Patent No.: US 6,642,568 B2
(45) Date of Patent: Nov. 4, 2003

(54) SEMICONDUCTOR DEVICE AND METHOD OF MANUFACTURING THE SAME

(75) Inventors: Kazuhito Narita, Yokkaichi (JP); Eiji Sakagami, Yokkaichi (JP); Hiroaki Tsunoda, Yokkaichi (JP); Masahisa Sonoda, Yokkaichi (JP); Hideyuki Kobayashi, Yokkaichi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 09/892,487

(22) Filed: Jun. 28, 2001

(65) Prior Publication Data
US 2002/0030223 A1 Mar. 14, 2002

(30) Foreign Application Priority Data
Jun. 30, 2000 (JP) .......................................... 2000-197801

(51) Int. Cl.[7] ........................ H01L 29/76; H01L 29/788
(52) U.S. Cl. ................... 257/314; 257/315; 257/318; 257/320
(58) Field of Search .................................. 257/314, 315, 257/318, 321

(56) References Cited

U.S. PATENT DOCUMENTS
6,232,635 B1 * 5/2001 Wang et al. ................. 257/318

FOREIGN PATENT DOCUMENTS
JP 8-227935 9/1996
JP 2000-232155 8/2000
KR 0174314 11/1998

* cited by examiner

Primary Examiner—Amir Zarabian
Assistant Examiner—Kiesha Rose
(74) Attorney, Agent, or Firm—Oblon, Spivak, McClelland, Maier & Neustadt, P.C.

(57) ABSTRACT

This invention provides a semiconductor device including a semiconductor substrate, a transistor having a gate insulation film on the semiconductor substrate and a gate electrode on the gate insulation film, and a device isolating insulation film having a first portion which extends from a surface of the semiconductor substrate to an inner part of the semiconductor substrate and a second portion which protrudes from the semiconductor substrate, wherein a side surface of the second portion is in direct contact with a side surface of the gate electrode at least partially and a cross section of the gate electrode is reverse tapered. This invention also provides a manufacturing method thereof.

4 Claims, 13 Drawing Sheets

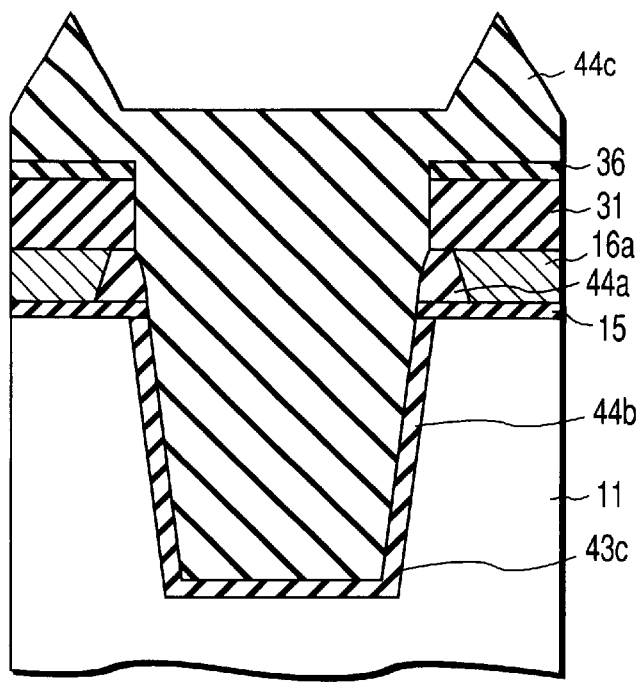
F I G. 7D
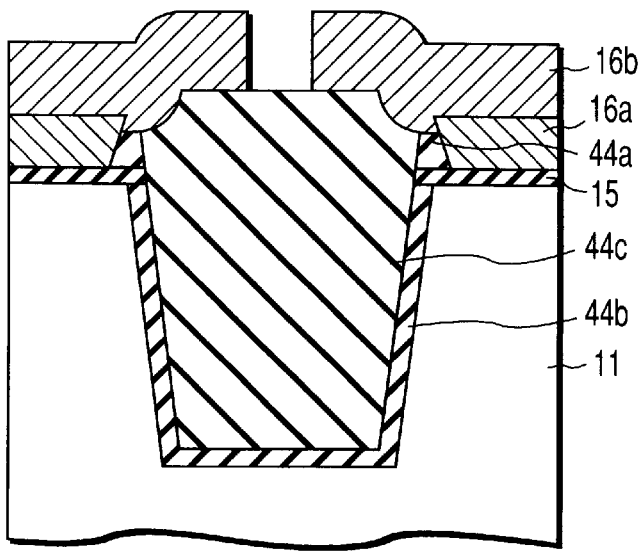
F I G. 7E

SEMICONDUCTOR DEVICE AND METHOD OF MANUFACTURING THE SAME

CROSS-REFERENCE TO RELATED APPLICATIONS

This application is based upon and claims the benefit of priority from the prior Japanese Patent Application No. 2000-197801, filed Jun. 30, 2000, the entire contents of which are incorporated herein by reference.

BACKGROUND OF THE INVENTION

The present invention relates to a semiconductor device and a manufacturing method thereof. In particular, the present invention relates to a semiconductor device to be produced through the utilization of STI technique which is designed such that a gate insulation film and a gate electrode are successively formed at first and then a device isolating insulation film is buried, and also to a manufacturing method which is applicable to the manufacture of such a semiconductor device.

The STI (Shallow Trench Isolation) technique has been conventionally known as a device isolating technique which is adapted to be employed in the manufacture of a high-integrated memory such as an NAND type EEPROM, etc. This technique is featured in that a shallow trench is formed as a device isolating region on the surface of semiconductor substrate, and then, a device isolating insulation film is buried or filled in this groove. In the specific application of this STI technique, it is possible to utilize either [a] a system wherein a device isolating insulation film is buried in a groove at first, and then, a gate insulation film and a gate electrode are successively formed in a device region; or [b] a system wherein a gate insulation film and a gate electrode material film are successively formed all over the surface of substrate at first, and then, these gate electrode material film and gate insulation film as well as the surface of substrate are selectively etched away to form a groove, into which a device isolating insulation film is subsequently filled.

FIGS. 1A, 1B, and 2A to 2C schematically show one example of the conventional manufacturing process of the NAND type EEPROM, wherein the aforementioned system [b] is utilized. Specifically, FIG. 1A shows a plan view schematically illustrating one of the manufacturing steps; and FIG. 1B shows a cross-sectional view taken along the line 1B—1B of the structure shown in FIG. 1A. On the other hand, FIG. 2A shows a plan view schematically illustrating a post step subsequent to the step shown in FIGS. 1A and 1B; FIG. 2B shows a cross-sectional view taken along the line 2B—2B of the structure shown in FIG. 2A; and FIG. 2C shows a cross-sectional view taken along the line 2C—2C of the structure shown in FIG. 2A. By the way, in these FIGS. 1A, 1B, and 2A to 2C, the reference numeral 2 denotes a device region, and the reference numeral 4 denotes a device isolating insulation film defining the device isolating region.

According to the conventional manufacturing process of the NAND type EEPROM, wherein the aforementioned system [b] is utilized, a gate insulation film (tunnel insulation film) 5, a gate electrode material film 6a to be formed into a portion of a floating gate electrode, and a silicon nitride film 7 to be employed as a stopper film in a CMP (Chemical Mechanical Polishing) treatment are successively formed at first on the surface of a silicon substrate 1. Then, by making use of a resist pattern as a mask, the gate electrode material film 6a, the gate insulation film 5 and the surface of silicon substrate 1 are selectively etched away by means of RIE method, thereby forming a groove 3. Thereafter, the device isolating insulation film 4 is formed so as to fill the groove 3 with the device isolating insulation film 4, and the redundant portion of the device isolating insulation film 4 which is located outside the groove 3 is removed by means of CMP method, thereby obtaining the structure shown in FIGS. 1A and 1B.

Next, the silicon nitride film 7 is removed, and a regressing treatment to remove an upper portion of the device isolating insulation film 4 which protrudes from the groove 3 is performed. Then, a gate electrode material film 6b to be employed as a floating gate electrode 6 in combination with the gate electrode material film 6a is formed. After a slit is formed in each of the portions of the gate electrode material film 6b which are located respectively over the device isolating insulation film 4, an interlayer gate insulation film 8 is formed all over the gate electrode material film 6b including the slit portions. Then, a control gate electrode film 9 is formed on the surface of this interlayer gate insulation film 8. Subsequently, the control gate electrode film 9, the interlayer gate insulation film 8, the gate electrode material film 6b and the gate electrode material film 6a are patterned en bloc to obtain a structure as shown in FIGS. 2A to 2C.

In the structure shown in FIGS. 2A to 2C, the floating gate electrodes 6 adjacent to each other in the arraying direction of the control gate electrode 9 are required to be insulated from each other. However, according to the aforementioned method, since the upper portion of the device isolating insulation film 4 that protrudes from the groove 3 is reverse tapered in cross-section, a peripheral portion of the gate electrode material film 6a is caused to be located below the side surface of the device isolating insulation film 4. As a result, as shown in FIG. 2C, this peripheral portion of the gate electrode material film 6a which is located below the side surface of the device isolating insulation film 4 is failed to be etched and caused to be left remained thereat on the occasion of the patterning process of the gate electrode material film 6a. Namely, an etching residue 10 is caused to be produced between the control gate electrode 9 adjacent to each other. This etching residue 10 naturally invites the short circuit between adjacent floating gate electrodes 6 located in the arraying direction of the control gate electrode 9. Namely, the conventional manufacturing process of the NAND type EEPROM where the aforementioned system [b] is utilized is accompanied with the problem that the short circuit between floating gate electrodes is likely to be occurred.

BRIEF SUMMARY OF THE INVENTION

The present invention has been achieved in view of the aforementioned problem, and therefore, an object of the present invention is to provide an STI technique wherein a gate insulation film and a gate electrode material film are successively formed at first and then, a device isolating film is buried, and which is improved so as to prevent the short circuit between the gate electrodes.

Another object of the present invention is to provide a semiconductor device and a manufacturing method of the semiconductor device, which are featured in that the occurrence of short circuit between gate electrodes can be substantially suppressed in the manufacturing process of semiconductor device.

According to a first aspect of the present invention, there is provided a semiconductor device comprising a semiconductor substrate, a transistor comprising a gate insulation film on the semiconductor substrate and a gate electrode on the gate insulation film, and a device isolating insulation film comprising a first portion which extends from a surface of the semiconductor substrate to an inner part of the semiconductor substrate and a second portion which protrudes from the semiconductor substrate, wherein a side surface of the second portion is in direct contact with a side surface of the gate electrode at least partially and a cross section of the gate electrode is reverse tapered.

According to a second aspect of the present invention, there is provided a method of manufacturing a semiconductor device comprising forming a laminate structure comprising a gate insulation film on a semiconductor substrate and a gate electrode material film on the gate insulation film, processing the gate electrode material film to obtain a gate electrode having a reverse tapered cross section, and forming a device isolating insulation film being in direct contact with a side surface of the gate electrode.

By the term "forward tapered", it is meant that as far as it is employed with reference to a recessed portion such as groove, the width of the recessed portion decreases gradually from the opening portion thereof to the bottom portion thereof, whereas as far as it is employed with reference to a thin film, the width of the thin film decreases gradually from the bottom surface thereof to the top surface thereof. On the other hand, by the term "reverse tapered", it is meant that as far as it is employed with reference to a recessed portion such as groove, the width of the recessed portion increases gradually from the opening portion thereof to the bottom portion thereof, whereas as far as it is employed with reference to a thin film, the width of the thin film increases gradually from the bottom surface thereof to the top surface thereof.

As described above, according to the first and second aspects of the present invention, the gate electrode is formed so as to have a reverse tapered cross-section. If the gate electrode is formed into such a cross-sectional configuration, there would be little possibility that the patterning of the gate electrode is obstructed by the device isolating insulation film. Therefore, according to the first and second aspects of the present invention, it is possible to prevent the occurrence of short circuit between gate electrodes that might otherwise be induced by the etching residue.

By the way, the structure where at least part of side surface of the gate electrode is in direct contact with the side surface of the second portion of device isolating insulation film can be obtained only when the aforementioned system [b] is employed, so that it is impossible to obtain such a structure in the case where the aforementioned system [a] is employed. Namely, if it is tried to realize the same structure as mentioned above by making use of the aforementioned system [a], any kind of layer would be necessarily interposed between the gate electrode and the second portion of device isolating insulation film.

The method according to the second aspect of the present invention may further comprises, after the formation of the device isolating insulation film, removing a portion of the gate electrode to divide the gate electrode into a plurality of portions. Further, in the method according to the second aspect of the present invention, the device isolating insulation film may comprise a first portion which extends from a surface of the semiconductor substrate into an inner part of the semiconductor substrate and a second portion which protrudes from the surface of the semiconductor substrate.

In the method according to the second aspect, the processing of the gate electrode material film may comprise partially removing each of the semiconductor substrate, the gate insulation film and the gate electrode material film to obtain a groove, a bottom of the groove being constituted by the semiconductor substrate and sidewalls of the groove being constituted by the semiconductor substrate, the gate insulation film and the gate electrode. In this case, the formation of the device isolating insulation film may comprise forming a first device isolating insulation film on each of the sidewalls such that the first device isolating insulation film becomes thinner toward an opening of the groove, and forming a second device isolating insulation film in the groove after the formation of the first device isolating insulation film.

Alternatively, in the method according to the second aspect, the processing of the gate electrode material film may comprise partially removing the gate electrode material film to obtain a groove, a bottom of the groove being constituted by the semiconductor substrate and sidewalls of the groove being constituted by the gate electrode. In this case, the formation of the device isolating insulation film may comprise forming a first device isolating insulation film on each of the sidewalls, and forming a second device isolating insulation film in the groove after formation of the first device isolating insulation film.

In former case, the first device isolating insulation film may be formed by means of a deposition method. On the other hand, in latter case, the first device isolating insulation film may be formed by oxidizing a side surface of the gate electrode or by means of a deposition method.

The formation of the second device isolating insulation film may be performed such that a bottom of the second device isolating insulation film is lower in position than a interface between the gate insulation film and the semiconductor substrate.

In the method according to the second aspect of the present invention, the gate electrode may be formed by anisotropically etching the gate electrode material film.

In the method according to the second aspect of the present invention, the partial removal for obtaining the groove may be performed such that a width of the groove becomes wider toward an opening of the groove.

In the method according to the second aspect of the present invention, the device isolating insulation film to be employed for filling the groove should preferably be formed in two steps as mentioned above. Namely, a first device isolating insulation film is formed inside the groove in a manner to make the groove into a forward tapered configuration in cross-section, and then, a second device isolating insulation film is formed inside the groove so as to fill the groove with the second device isolating insulation film. According to this method, the occurrence of short circuit between the gate electrodes due to an inappropriate filling of the groove can be prevented.

In the first and second aspects of the present invention, the gate electrode may constitute at least a portion of floating gate electrode, and the transistor may further comprise an interlayer gate insulation film on the floating gate electrode and a control gate electrode on the interlayer insulation film. Namely, the transistor may be a non-volatile memory transistor.

In the first and second aspects of the present invention, the side surface of the first portion on the gate electrode side may be disposed contiguous with the side surface of the second portion on the gate electrode side. Alternatively, the side surface of the first portion on the gate electrode side may be disposed discontinuously with the side surface of the second portion on the gate electrode side, and still more, the width of the second portion is larger than the width of the first portion.

It is preferable in the first and second aspects of the present invention that the cross-section of the second portion is forward tapered. It is also preferable that the contacting face between the side surface of the gate electrode and the side surface of the second portion is inclined at an angle of not more than 100° to the interface between the gate electrode and the gate insulation film.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently embodiments of the invention, and together with the general description given above and the detailed description of the embodiments given below, serve to explain the principles of the invention.

FIGS. 7A to 7H are cross-sectional views schematically showing the manufacturing process of the flash memory according to a second embodiment of the present invention;

DETAILED DESCRIPTION OF THE INVENTION

Figure 1A:
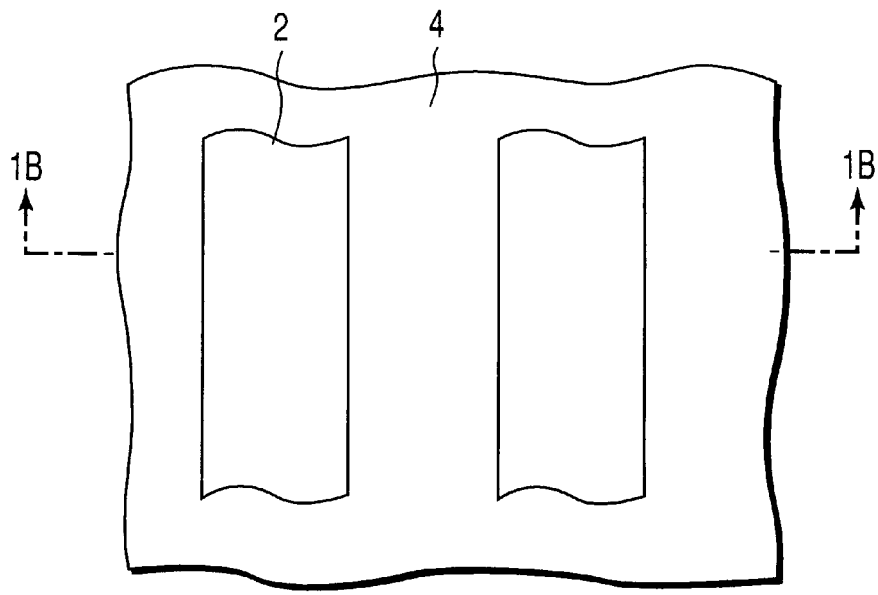
FIGS. 1A, 1B, and 2A to 2C are views schematically showing an example of the conventional manufacturing process of the NAND type EEPROM.
Figure 1B:
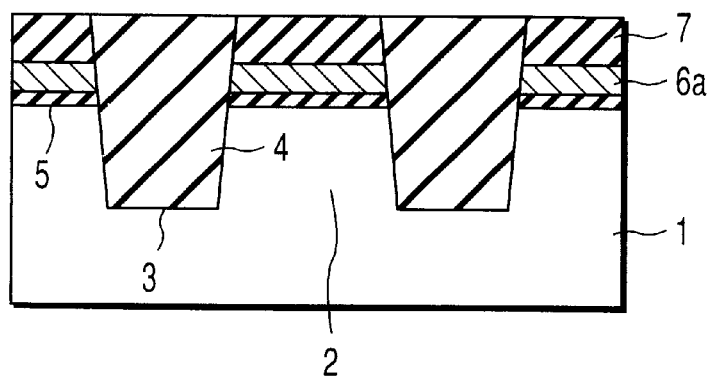
Figure 2A:
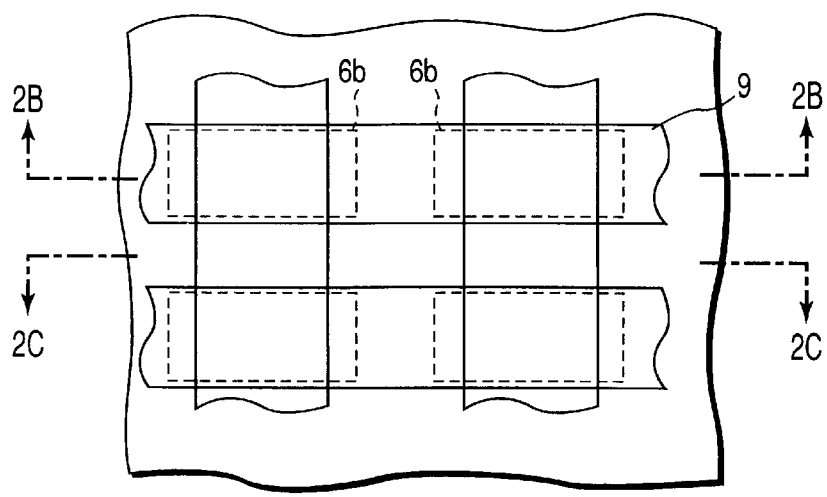
Figure 2B:
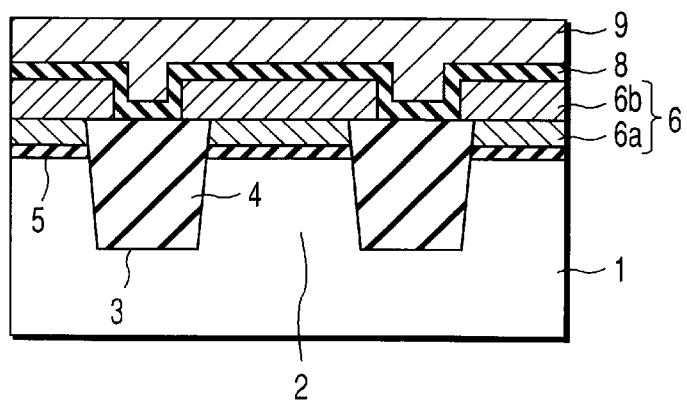
Figure 2C:
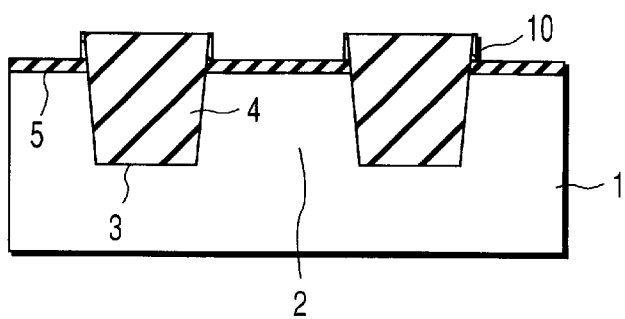

The present invention will be described in more detail below with reference to the accompanying drawings. The same reference numerals denote the same parts in the drawing, and a duplicate explanation will be omitted.

Figure 3:
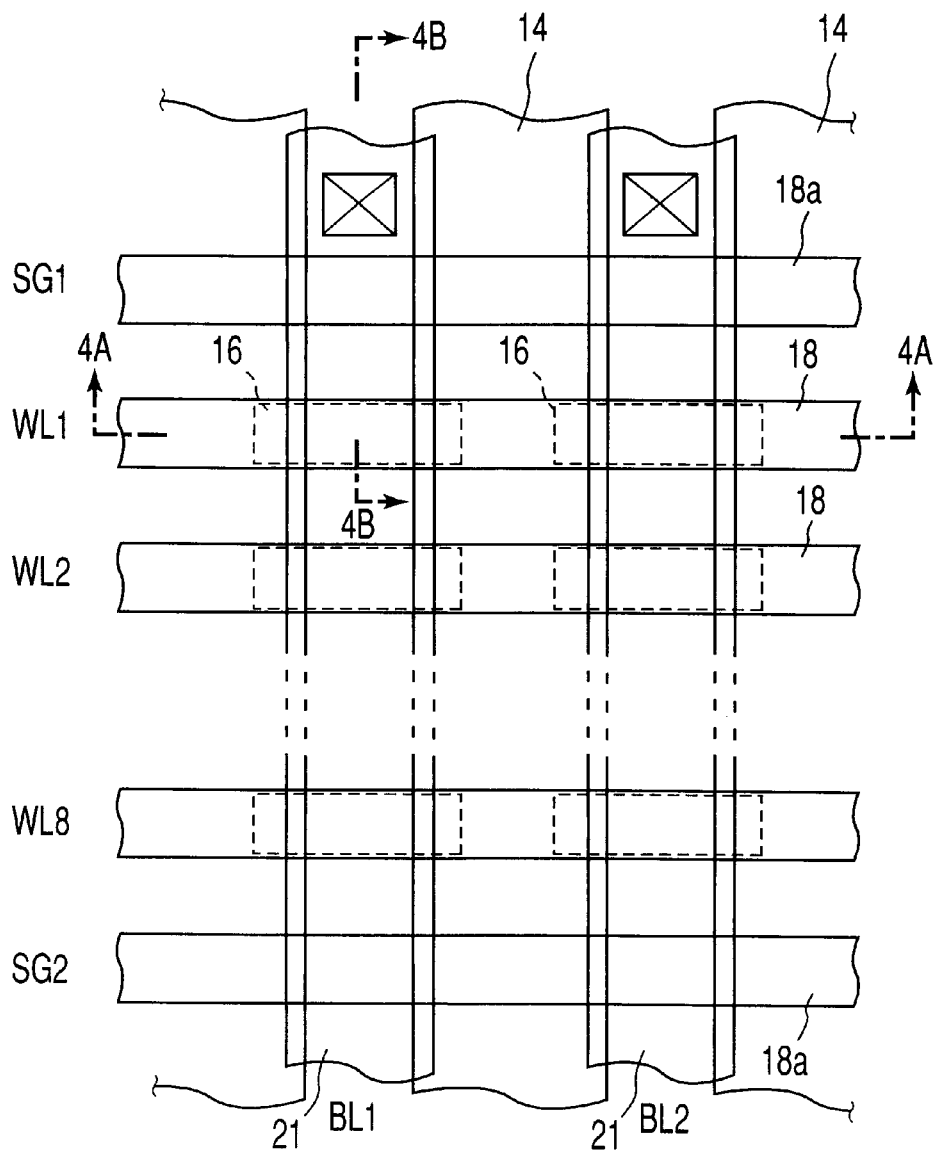
FIGS. 3, 4A and 4B are views schematically showing the structure of the memory array portion of the NAND type EEPROM according to a first embodiment of the present invention.
Figure 4A:
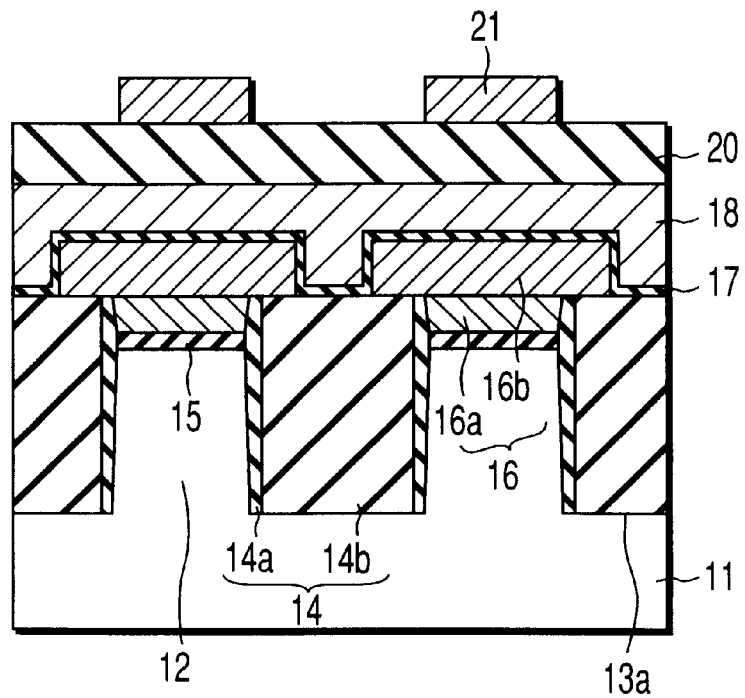

FIG. 3 is a plan view schematically showing the structure of the memory array portion of the NAND type EEPROM according to the first embodiment of the present invention. FIG. 4A is a cross-sectional view taken along the line 4A—4A of the structure shown in FIG. 3, while FIG. 4B is a cross-sectional view taken along the line 4B—4B of the structure shown in FIG. 3.

Figure 4B:
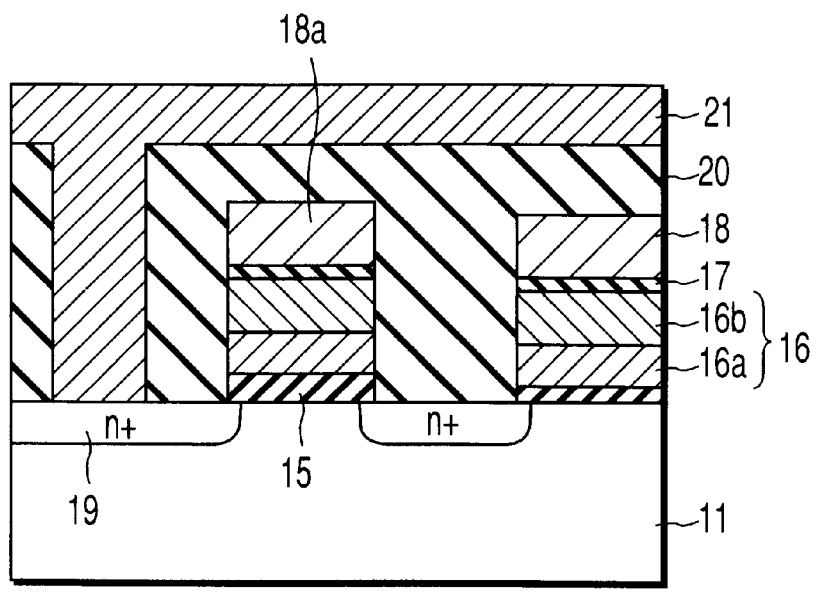

Referring to the structure shown in FIGS. 3, 4A and 4B, a groove 13a for device isolating is formed by making use of an STI technique in one of the main surfaces of a p-type silicon substrate 11. This groove 13a is filled therein with a first device isolating insulation film 14a and a second device isolating insulation film 14b, both constituting a device isolating region. The element region 12 surrounded by these first device isolating insulation films 14a and second device isolating insulation films 14b is formed stripe-like, on which a gate insulation film (tunnel insulation film) 15 and a floating gate electrode 16 are successively formed. Further, an interlayer gate insulation film 17 and a control gate electrode 18 are successively formed on the surface of the floating gate electrode 16.

By the way, according to this embodiment, this floating gate electrode 16 has a laminate structure of a first gate electrode material film 16a and a second gate electrode material film 16b. Among these gate electrode material films 16a and 16b, the deposition of the first gate electrode material film 16a is performed prior to the steps of filling the device isolating insulation films 14a and 14b. Further, the side surfaces of the first gate electrode material film 16a is reverse tapered in cross-section as shown in FIG. 4A as explained in detail hereinafter.

As shown in FIGS. 3, 4A and 4B, the control gate electrode 18 is formed so as to be utilized as a word line WL. Whereas the selective gate electrode 18a is formed so as to be utilized as a selective gate line SG parallel to the word line WL. These control gate electrode 18 and selective gate electrode 18a can be formed concurrently from the same thin film.

The floating gate electrode 16 is formed in a self-aligned manner by making use of these control gate electrode 18 and selective gate electrode 18a, and is individually disposed for each of the memory transistors formed within the NAND type cell. In the surface region of the substrate 11, there is formed the source/drain diffusion layer 19 of each of the transistors of the NAND type cell, the source/drain diffusion layer 19 being formed through an ion implantation where these control gate electrode 18 and selective gate electrode 18a are employed as a mask.

All over these control gate electrode 18 and selective gate electrode 18a, there is formed an interlayer insulation film 20, on which bit lines (BL) 21 to be connected with one end of the NAND cell are formed so as to perpendicularly intersect with word lines WL.

By the way, as seen from FIG. 4B, although the control gate electrode 18 is constructed almost in the same manner as the selective gate electrode 18a is, the gate insulation film 15 disposed immediately below the selective gate electrode 18a is formed larger in thickness as compared with that of the memory transistor portion. Further, the selective gate electrode 18a is connected, at a predetermined place other than the position of cross-section shown in FIG. 4B, with the gate electrode material film 16b of the floating gate electrode 16 that has been formed as a continuous pattern without being separated in the direction of word line.

The NAND type memory cell array explained above can be manufactured by the following method, which will be explained with reference to FIGS. 5A to 5H.

Figure 5A:
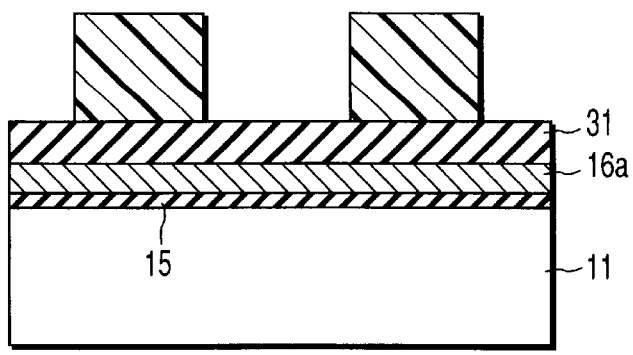
FIGS. 5A to 5H are cross-sectional views schematically showing the manufacturing process of the NAND type memory cell array according to the first embodiment of the present invention.

FIGS. 5A to 5H are cross-sectional views schematically showing the manufacturing process of the NAND type memory cell array according to the first embodiment of the present invention. In order to manufacture the NAND type memory cell array shown in FIGS. 3, 4A and 4B, first of all, as shown in FIG. 5A, the gate insulation film 15 is formed on one of the main surfaces of the silicon substrate 11, and then, a first gate electrode material film 16a to be employed as a portion of the floating gate electrode 16 is deposited on the surface of this gate insulation film 15. Then, a silicon nitride film 31 to be employed as a stopper film in the CMP treatment of the device isolating insulation films 14a and 14b is deposited on the surface of the first gate electrode material film 16a. By the way, in this embodiment, the gate insulation film is formed by way of thermal oxidation, while the first gate electrode material film 16a is formed of an amorphous silicon film or a polycrystalline silicon film.

Figure 5B:
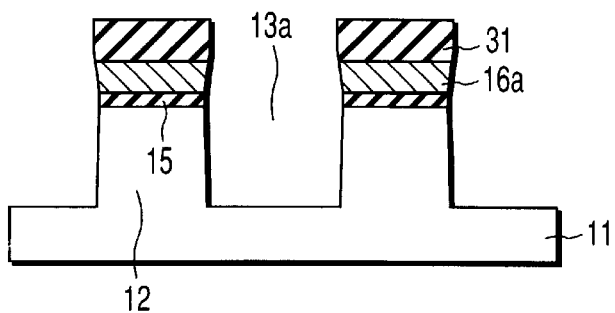

Thereafter, a resist pattern 32 having an opening at the device isolating region is formed on the surface of the silicon nitride film 31 by means of lithography technique. Then, by making use of this resist pattern 32 as a mask, the silicon nitride film 31, the gate electrode material film 16a and the gate insulation film 15 are patterned as shown in FIG. 5B by means of RIE method as an anisotropic dry etching method. On this occasion, the silicon nitride film 31 and the gate insulation film 15 are worked so as to be formed into a rectangular or forward tapered cross-sectional configuration with an angle of 80 to 90°. On the other hand, the gate electrode material film 16a is formed into a reverse tapered cross-sectional configuration with the exposed side surface thereof being inclined at an angle of not more than 100° to the interface between the gate electrode material film 16a and the gate insulation film 15.

Thereafter, the exposed surface of the silicon substrate 11 is etched away to form a shallow groove 13a to be employed for the device isolating. As a result, the element region 12 of stripe pattern is formed. By the way, although the gate electrode material film (or "gate electrode") 16a is also worked into the same pattern as that of the element-forming region 12, the isolation of the memory transistors from each other within the NAND cell is not performed at this stage.

Figure 5C:
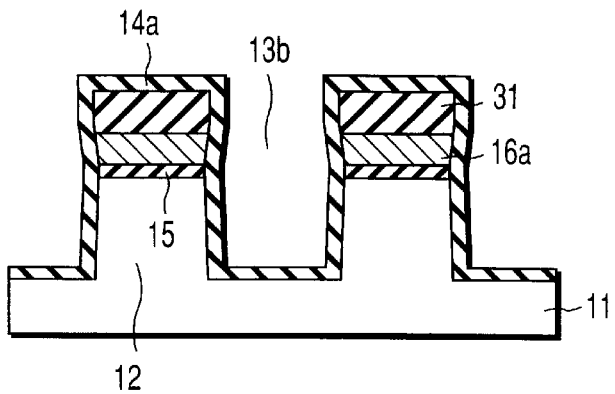
Figure 5D:
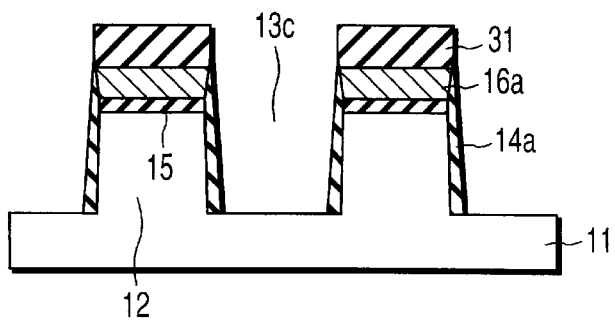

After this resist pattern 32 has been removed, a silicon oxide film constituting the device isolating insulation film 14a is formed by means of CVD method as shown in FIG. 5C. The thickness of this silicon oxide film 14a is controlled such that the groove 13b having a maximum width which is smaller than the opening width of the groove 13a can be formed in the groove 13a. Thereafter, as shown in FIG. 5D, the entire surface is back-etched by means of RIE method to partially remove the silicon oxide film 14a in such a way that a groove 13c having a forward tapered cross-sectional configuration can be formed in the groove 13a.

Figure 5E:
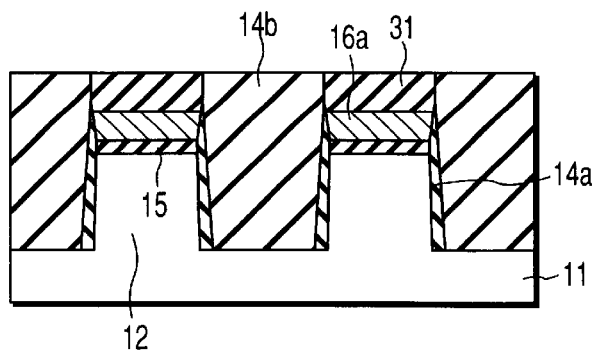

Then, a silicon oxide film functioning as the device isolating film 14b is deposited by means of CVD method. Thereafter, a portion of the silicon oxide film 14b which is disposed outside the groove 13c is removed by means of CMP treatment where the silicon nitride film 31 is employed as a stopper film. As a result, as shown in FIG. 5E, the entire surface including that of the silicon oxide film 14b is flattened, and at the same time, the silicon nitride film 31 is allowed to expose.

Figure 5F:
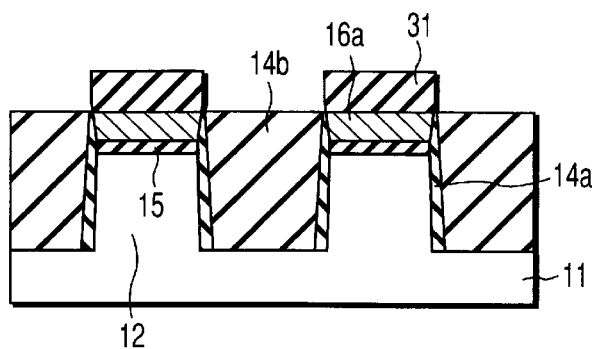

Thereafter, as shown in FIG. 5F, the level of the surfaces of the device isolating insulation films 14a and 14b are lowered by means of isotropic etching. This regressing treatment is performed in such a way that the gate insulation film 15 can be prevented from being exposed. It should be noted that this regressing treatment in this case is performed by means of wet etching in such a way that the level of surfaces of the device isolating insulation films 14a and 14b becomes flush with the level of the upper surface of gate electrode material film 16a.

Figure 5G:
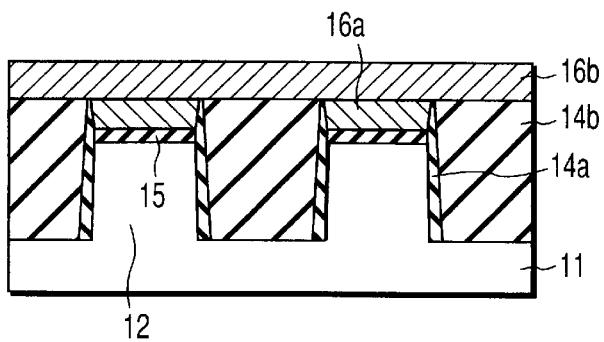

As shown in FIG. 5G, the silicon nitride film is then etched away to allow the upper surface of the gate electrode material film 16a to be exposed, and then, a second gate electrode material film 16b is deposited thereon.

Figure 5H:
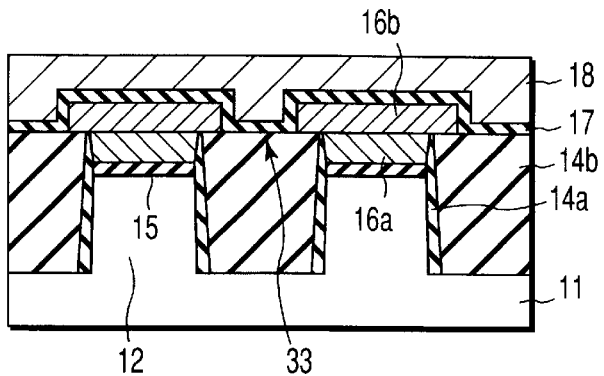

Subsequently, as shown in FIG. 5H, for the purpose of partitioning the second gate electrode material film 16b in the direction of the word line, a partitioning slit 33 is formed in this second gate electrode material film 16b in conformity with the location of the device isolating region. Then, an interlayer gate insulation film 17 such as an ONO film (a 3-ply film consisting of a silicon oxide film, a silicon nitride film and a silicon oxide film) and a control gate electrode 18 are successively formed. As shown in FIGS. 3, 4A and 4B, the control gate electrode 18 is then patterned into word lines each extending in a direction perpendicular to the stripe-like element region 12. Simultaneous with this patterning of the control gate electrode 18, the second gate electrode material film 16b and the first gate electrode material film 16a, both disposed below the control gate electrode 18, are also patterned, thereby enabling the floating gate electrode 16 of each of the memory transistors to be formed in a self-aligned manner.

In this case, as explained above, the gate electrode material film (or "gate electrode") 16a is formed so as to have a reverse tapered cross-section. Therefore, there is no possibility that the etching of the gate electrode 16a is obstructed by the device isolating insulation films 14a and 14b on the occasion of working the gate electrode 16a into a pattern. As a result, it is possible to prevent not only the generation of etching residue but also the occurrence of the short circuit between floating gates.

Thereafter, as shown in FIGS. 4A and 4B, an interlayer insulation film 20 is deposited thereon and then, bit lines 21 are formed on the interlayer insulation film 20 according to ordinary process. As a result, the NAND type memory array as shown in FIGS. 3, 4A and 4B can be obtained.

As explained above, since the gate electrode material film 16a is formed so as to have a reverse tapered cross-section in this embodiment, the generation of etching residue can be prevented. It may be possible to obtain the aforementioned effects without performing the deposition of the device isolating insulation film in two separate stages on the occasion of filling it into the groove 13a. However, if this deposition of the device isolating insulation film is performed in one step, the following problem may be raised.

Figure 6A:
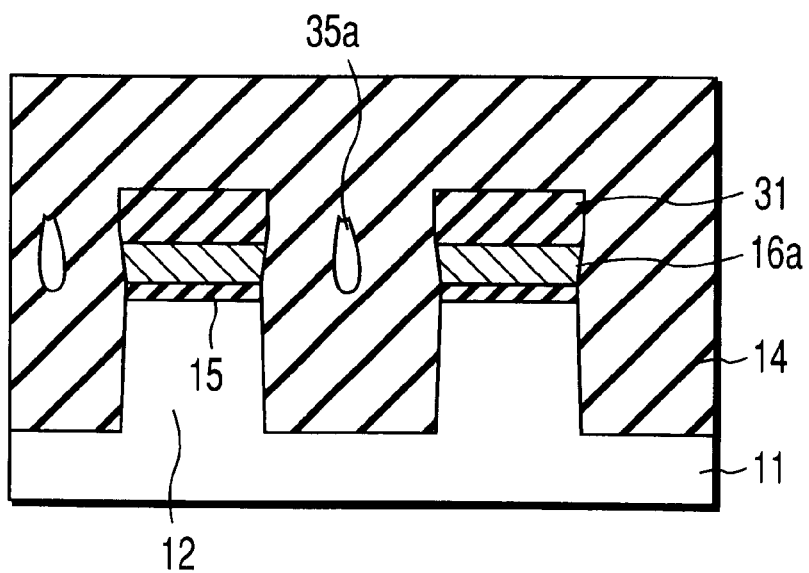
FIGS. 6A and 6B are cross-sectional views schematically showing the manufacturing process of the NAND type memory array, wherein a portion of the manufacturing process according to the first embodiment of the present invention is omitted.
Figure 6B:
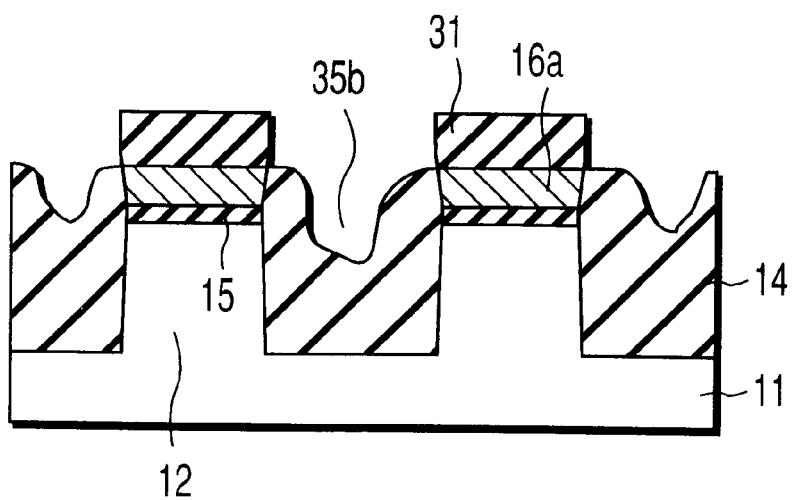

FIGS. 6A and 6B are cross-sectional views schematically illustrating the manufacturing process of the NAND type memory array according to the first embodiment of the present invention, wherein a portion of the manufacturing process is omitted. Specifically, FIG. 6A shows the structure that can be obtained by filling the device isolating insulation film 14 into the groove 13a after the step shown in FIG. 5B. If the gate electrode material film 16a is formed so as to have a reverse tapered cross-section in this manner, a defective filling 35a is likely to be generated in the device isolating insulation film 14.

Further, if the structure having this defective filling 35a is thereafter subjected to various post treatments including the flattening of the device isolating insulation film 14 by means of CMP method, the removal of the silicon nitride film 31, and a regressing treatment for removing a protruded portion of the device isolating insulation film 14 that has been protruded upward from the groove 13a, this defective filling 35a is inevitably exposed during in any of these steps, so that this defective filling 35a is caused to expand, thereby permitting an expanded defective filling 35b to be generated as shown in FIG. 6B.

If the structure having this expanded defective filling 35b is thereafter subjected to the process as explained with reference to FIG. 5G, this expanded defective filling 35b is buried inside the gate electrode material film 16b. As a result, the problem of short circuit between the gate electrodes 16 adjacent to each other in the longitudinal direction of the gate control electrode 18 may be raised. Therefore, it is preferable in this embodiment to perform the step of filling the device isolating insulation film into the groove 13a by separating it in two stages instead of performing it in one step.

Next, the second embodiment of the present invention will be explained. In this embodiment, the present invention is applied to the manufacture of a flash memory.

Figure 7A:
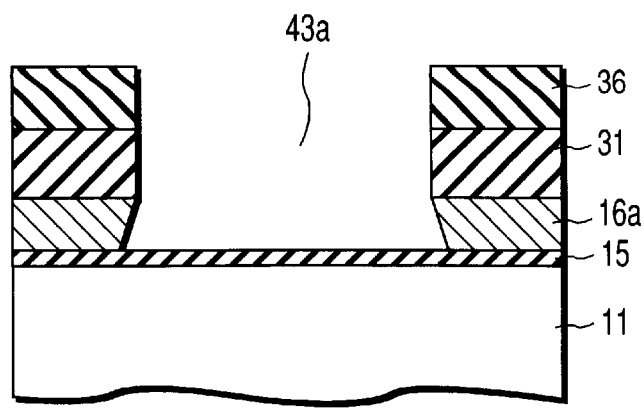
Figure 7B:
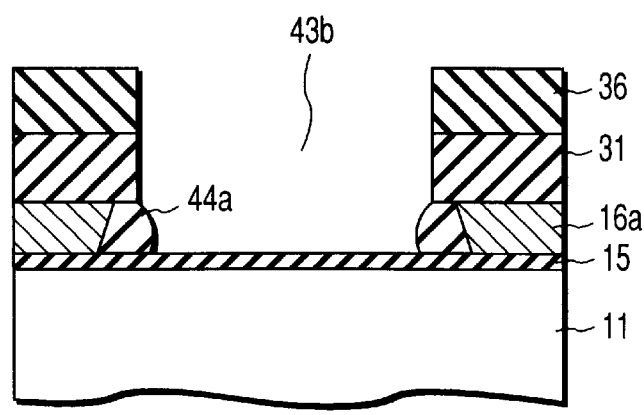
Figure 7C:
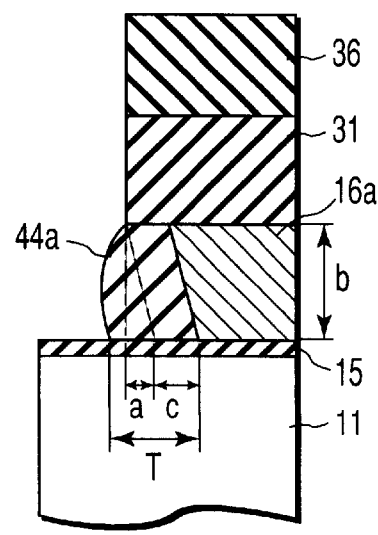
Figure 7F:
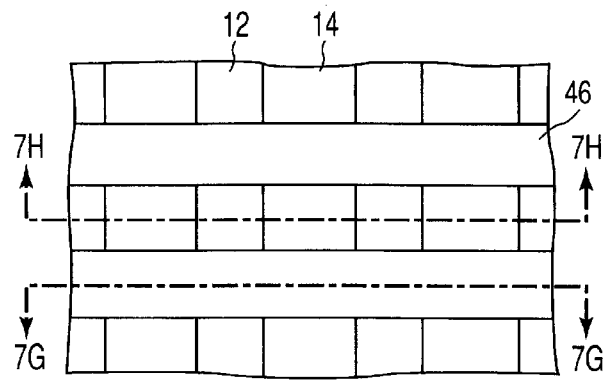
Figure 7G:
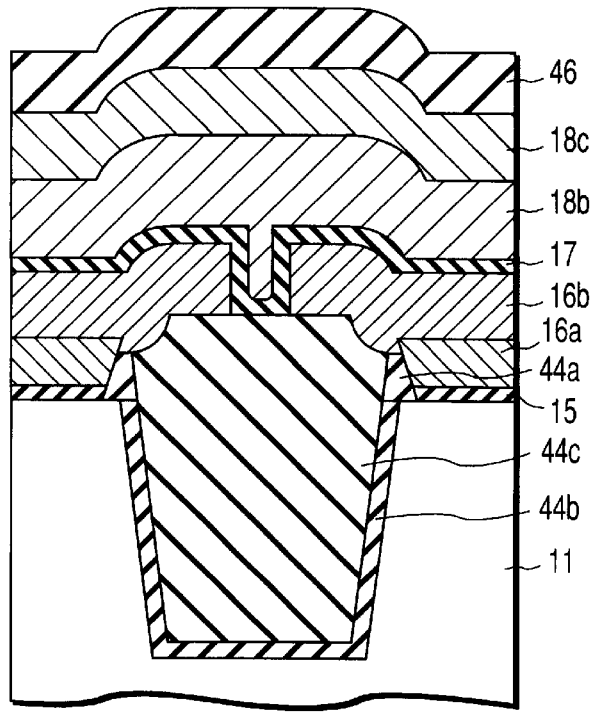
Figure 7H:
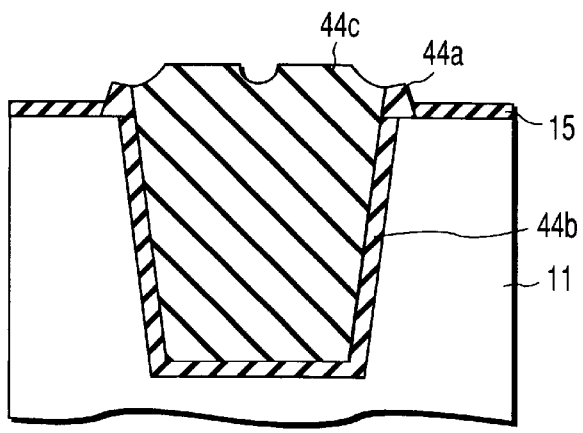

FIGS. 7A to 7H are views schematically showing the manufacturing process of the flash memory according to the second embodiment of the present invention; wherein FIGS. 7A, 7B, 7D and 7E are cross-sectional views each showing the manufacturing process; FIG. 7C is an enlarged partial cross-sectional view showing a portion of FIG. 7B; FIG. 7F is a plan view showing an accomplished structure; FIG. 7G is a cross-sectional view taken along the line 7G—7G of the structure shown in FIG. 7F; and FIG. 7H is a cross-sectional view taken along the line 7H—7H of the structure shown in FIG. 7F.

As shown in FIG. 7A, a silicon substrate 11 is heated in an oxygen gas atmosphere at a temperature of 800° C. to form a silicon oxide film 15 having a thickness of 10 nm on one of the main surfaces of the silicon substrate 11, the silicon oxide film 15 being subsequently utilized as a gate insulation film. Then, a polysilicon (polycrystalline silicon) film 16a having a thickness of 60 nm, a silicon nitride film 31 having a thickness of 100 nm, and a silicon oxide film 36 having a thickness of 150 nm are successively deposited on the surface of the silicon oxide film 15 by means of a low pressure CVD method.

Thereafter, a resist pattern (not shown) having an opening at the device isolating region is formed on the surface of the silicon oxide film 36 by means of lithography technique. Then, by making use of this resist pattern 32 as a mask, the silicon oxide film 36 and the silicon nitride film 31 are selectively etched away by means of RIE method to form a pattern. The silicon substrate 11 is then exposed to an oxygen gas plasma to remove the resist pattern. Then, by making use of the silicon oxide film 36 as a mask, the polysilicon film 16a is worked into a reverse tapered cross-sectional configuration. As a result, a groove 43a as shown in FIG. 7A can be obtained.

Then, as shown in FIG. 7B, a silicon substrate 11 is heated in an oxygen gas atmosphere at a temperature of 1000° C. to oxidize the side surface of the polysilicon film 16a, thereby forming a silicon oxide film 44a. The film thickness of the silicon oxide film 44 in this case is controlled so as to form a groove 43b whose width becomes narrower at the bottom portion thereof as compared with the width at the opening portion thereof. Namely, it is controlled in such a manner that, as shown in FIG. 7C, the film thickness "T" of the silicon oxide film 44a, the distance "a" between the side surface of the silicon nitride film 31 and the top of side surface of the polycrystalline silicon film 16a, and the horizontal distance "c" between the top of side surface of the polycrystalline silicon film 16a and the bottom of side surface of the polycrystalline silicon film 16a satisfy the relationship shown by the following inequalities:

$T > a+c$, and $T > 2a$.

Then, as shown in FIG. 7D, a portion of the silicon oxide film 44a that protrudes from the silicon nitride film 31, the silicon oxide film 15 and the surface of the silicon substrate 11 are selectively etched away by making of the silicon oxide film 36 as a mask, thereby forming a groove 43c. As a result, the silicon oxide film 44a is formed into a forward tapered configuration in cross-section. Thereafter, the silicon substrate 11 is heated in an oxygen gas atmosphere at a temperature of 1000° C. to form a silicon oxide film 44b having a thickness of 6 nm on the side walls and the bottom of the groove 43c. Thereafter, a silicon oxide film 44c is deposited by means of HDP (High Density Plasma) method so as to fill the groove 43c with the silicon oxide film 44c.

Thereafter, by means of CMP method, the surface of the silicon oxide film 44c is flattened and heated to a temperature of 900° C. in a nitrogen gas atmosphere. Then, the silicon substrate 11 is immersed into an HF buffering solution for 10 seconds to remove any residual portion of the silicon nitride film 36, and at the same time, the level of the top surface of the silicon oxide film 44c is allowed to regress. Then, the silicon substrate 11 is subjected to a phosphoric acid treatment at a temperature of 150° C. to remove the silicon nitride film 31. Thereafter, the exposed surface portion of silicon oxide film 44c is etched away by a thickness of 20 nm by making use of a dilute HF solution.

Subsequently, by means of low pressure CVD method, the polysilicon film 16b containing phosphorus is deposited thereon, and then, this polysilicon film 16b is patterned by means of RIE method and by making use of a resist pattern as a mask to obtain a structure as shown in FIG. 7E.

Then, by means of low pressure CVD method, an ONO film (a 3-ply film of a silicon oxide film having a thickness of 50 nm, a silicon nitride film having a thickness of 100 nm and a silicon oxide film having a thickness of 50 nm) 17, a phosphorus-added polysilicon film 18b having a thickness of 100 nm, a WSi film 18c having a thickness of 100 nm, and a silicon oxide film 46 having a thickness of 200 nm are successively deposited thereon. Next, a resist pattern is formed thereon by means of photolithography, and, by making use of this resist pattern, the silicon oxide film 46 is worked into a pattern by means of RIE method.

Then, by making use of the silicon oxide film 46 as a mask, the WSi film 18c, the polysilicon film 18b, the ONO film 17, the polysilicon film 16b and the polysilicon film 16a are successively patterned. In this case, the silicon oxide film 44a is formed into a forward tapered configuration in cross-section. Therefore, there is no possibility that the etching of the polysilicon film 16a is obstructed by the silicon oxide film 44a on the occasion of working the polysilicon film 16a into a pattern. As a result, it is possible to prevent not only the generation of etching residue but also the occurrence of the short circuit between floating gates. As a result, the structure shown in FIGS. 7F to 7H can be obtained.

By the way, according to the structure obtained in this manner, the device isolating insulation film is constituted by the silicon oxide films 44a to 44c. Further, the face constituting the sidewall of the groove 43c of the silicon substrate 11 is not contiguous with the face contacting with the device isolating insulation film of the polysilicon film 16a, and moreover, the latter face is placed on a far outer side as compared with the former face relative to the center of the groove 43.

As explained above, according to this embodiment, since the silicon oxide film 44a is formed so as to have a forward tapered cross-sectional configuration, the generation of etching residue can be prevented. When the silicon oxide film 44a is formed so as to have a forward tapered cross-sectional configuration as described above, the following advantages can be additionally obtained as explained below with reference to FIGS. 8A and 8B.

Figure 8A:
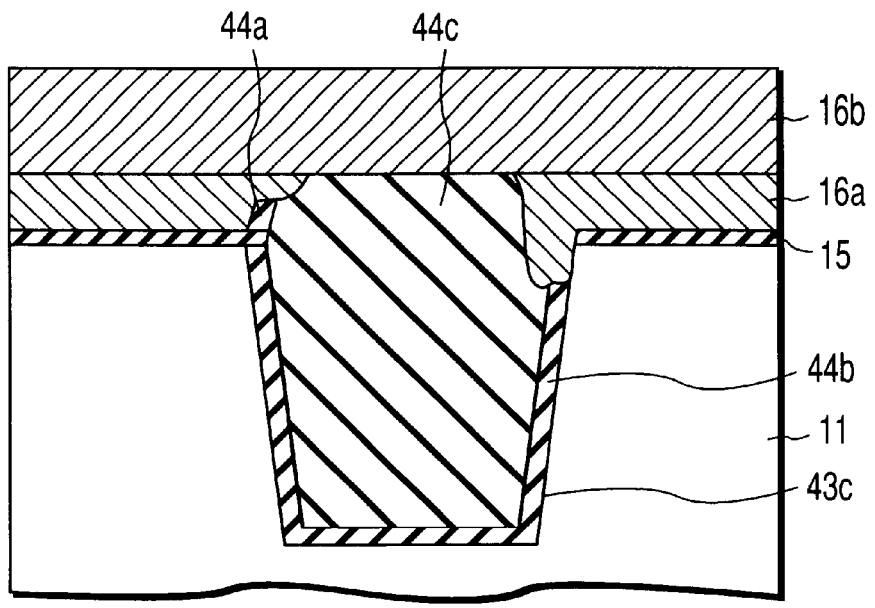
FIGS. 8A and 8B are cross-sectional views schematically showing the defect that have been generated due to the alteration of a portion of manufacturing process of the flash memory according to the second embodiment of the present invention.
Figure 8B:
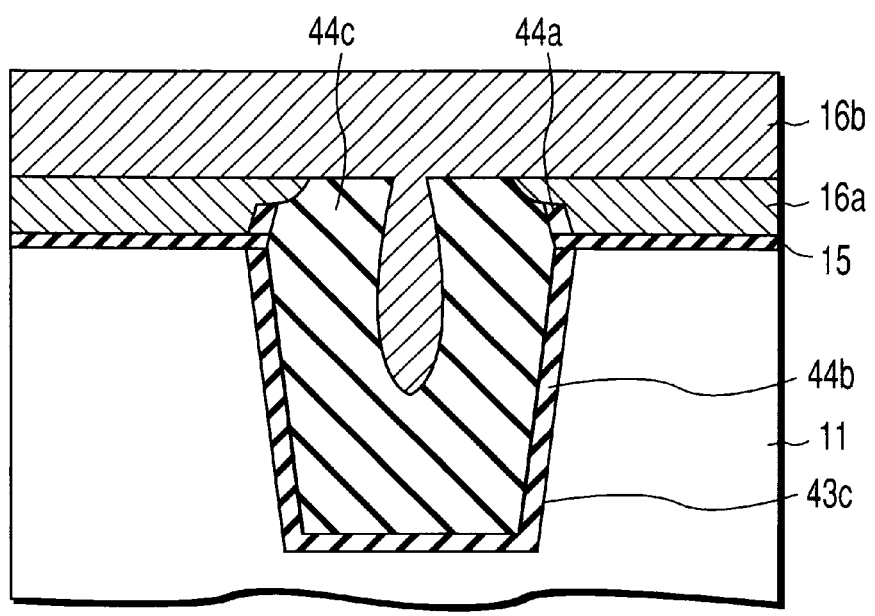

FIGS. 8A and 8B are cross-sectional views schematically showing the defectives that may be generated due to the alteration of a portion of manufacturing process of the flash memory according to the second embodiment of the present invention. In FIGS. 8A and 8B, the cross-sectional configuration of the silicon oxide film 44a is not forward tapered but simply inclined toward the groove. If the silicon oxide film 44a is formed into such a cross-sectional configuration, a void portion where the silicon oxide film 44c is not existed may be left remained at a lower portion of the silicon oxide film 44a disposed inside the groove 43c. On the other hand, if the silicon oxide film 44c is formed by means of LP-TEOS/O$_3$ method, a void portion where the silicon oxide film 44c is not existed may be left remained at a central portion of the groove 43c in the same manner as explained with reference to FIGS. 6A and 6B. As a result, this void portion is permitted to expand on the occasion of the etching for regressing the level of the upper surface of the silicon oxide film 44c, and this expanded void portion may be left buried in the polysilicon film 16b. Therefore, in the former case, a defective as shown in FIG. 8A would be generated, while in the latter case, a defective as shown in FIG. 8B would be generated.

Whereas, according to this embodiment, since the silicon oxide film 44a is formed so as to have a forward tapered cross-sectional configuration, it is now possible to prevent the generation of aforementioned void portion. Therefore, it is possible according to this embodiment to prevent the generation of defectives as shown in FIGS. 8A and 8B.

By the way, the temperature and film thickness adopted in the aforementioned second embodiment can be suitably altered as desired. For example, although the silicon oxide film 44a is formed at a temperature of 1000° C. and in an oxygen gas atmosphere in the above embodiment, the temperature may be optionally selected, and the atmosphere may be any other kind of oxidizing atmosphere such as an NO$_x$ or N$_2$O atmosphere.

Next, a third embodiment according to the present invention will be explained.

Figure 9A:
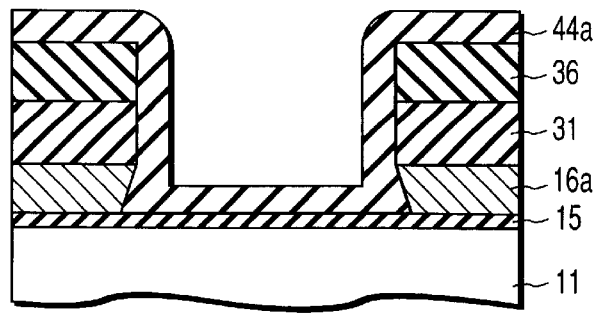
FIGS. 9A to 9C are cross-sectional views schematically showing the manufacturing process of the flash memory according to a third embodiment of the present invention.
Figure 9B:
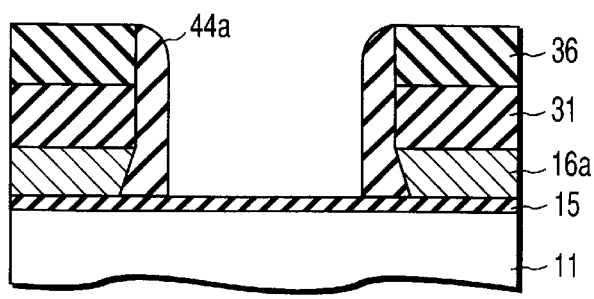
Figure 9C:
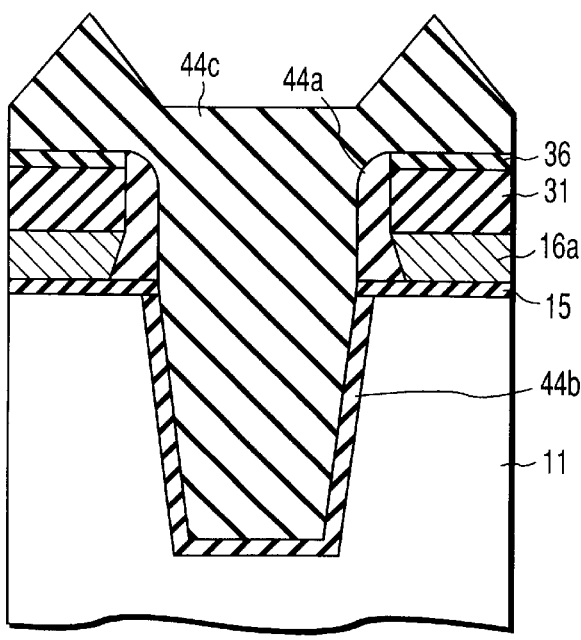

FIGS. 9A to 9C are cross-sectional views schematically illustrating the manufacturing process of the flash memory according to the third embodiment of the present invention. This third embodiment is almost the same as the second embodiment except that the method of forming the silicon oxide film 44a differs from that of the second embodiment.

Namely, first of all, in the same manner as explained in the second embodiment, a structure shown in FIG. 7A is obtained. Then, as shown in FIG. 9A, a silicon oxide film 44a having a film thickness of 20 nm is deposited on the surface of the structure by means of low pressure TEOS/O$_3$ method at a temperature of 700° C. (alternatively, plasma CVD method at 400° C.). Then, as shown in FIG. 9B, the entire surface is subjected to RIE to remove the silicon oxide film 44a located outside the groove 43a, thus selectively leaving only the portion of the silicon oxide film 44a that has been placed inside the groove 43a. Further, by way of the process explained with reference to FIG. 7D, a structure shown in FIG. 9C is obtained. Thereafter, by following the same steps as explained with reference to the second embodiment, a structure similar to that shown in FIGS. 7F to 7H can be obtained.

In this embodiment also, there is no possibility that the etching of the polysilicon film 16a is obstructed by the silicon oxide film 44a on the occasion of working the polysilicon film 16a into a pattern. As a result, it is possible to prevent not only the generation of etching residue but also the generation of the short circuit of floating gate. Additionally, it is possible, even with this embodiment, to prevent the generation of defectives as shown in FIGS. 8A and 8B.

Figure 10A:
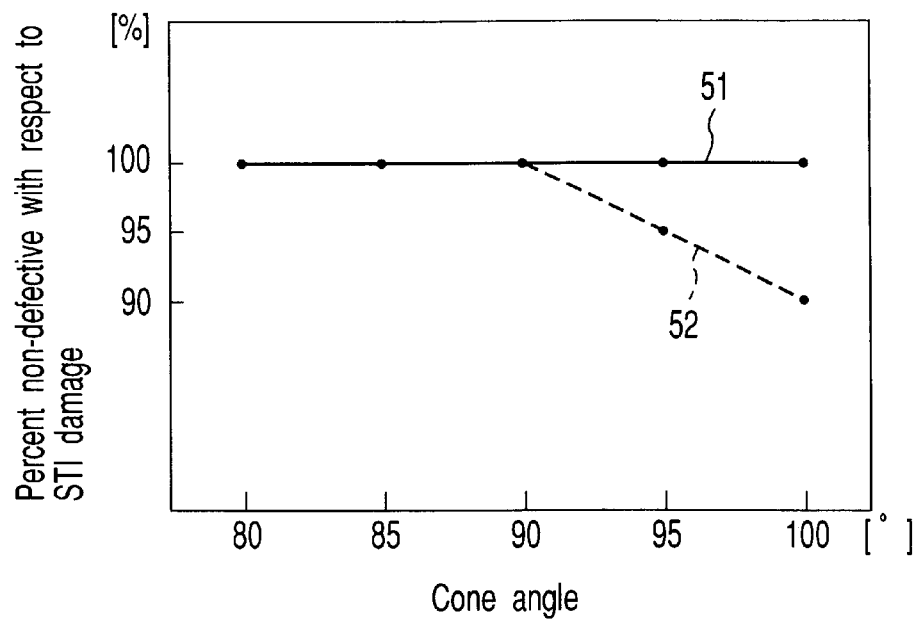
FIG. 10A is a graph illustrating the relationship between the cone angle of polycrystalline silicon film and the percent of the defective shown in FIGS. 8A and 8B.
Figure 10B:
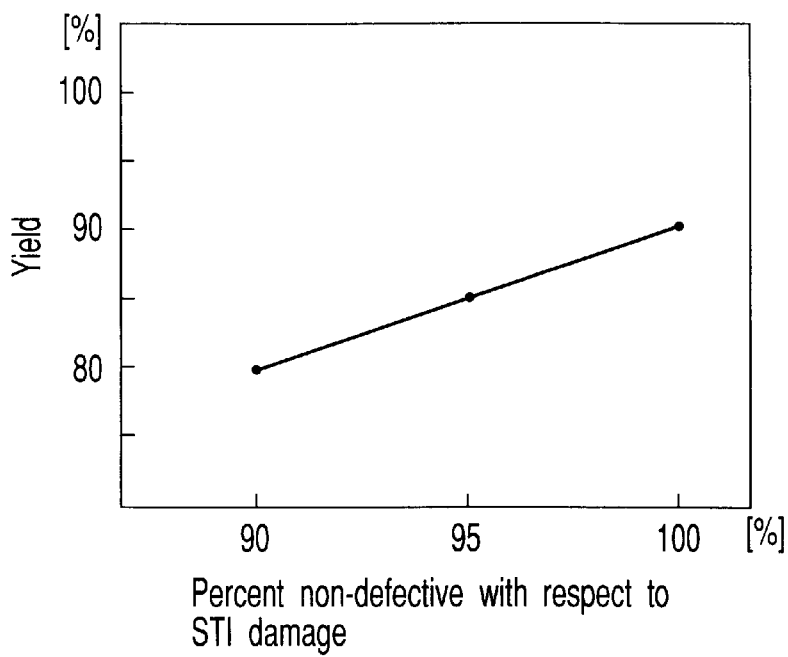
FIG. 10B is a graph illustrating the relationship between the yield and the percent of the defective shown in FIGS. 8A and 8B.

Next, the effects of improving the yield in the process according to the aforementioned second and third embodiments have been investigated, the results being shown in FIGS. 10A and 10B.

FIG. 10A is a graph illustrating the relationship between the cone angle of polysilicon film 16a and the percent of the defective shown in FIGS. 8A and 8B; and FIG. 10B is a graph illustrating the relationship between the yield and the percent of the defective shown in FIGS. 8A and 8B. In FIG. 10A, the abscissa represents the cone angle of polysilicon film 16a, while the ordinate represents the percent of the defective (damaged by the STI) shown in FIGS. 8A and 8B. In FIG. 10B, the reference numeral 51 represents a data which was obtained when the silicon oxide film 44a was formed into a cross-sectional configuration as shown in FIG. 7G, while the reference numeral 52 represents a data which was obtained when the silicon oxide film 44a was formed into a cross-sectional configuration as shown in FIG. 8B. By the way, in FIG. 10B, the abscissa represents the percent of the defective damaged by the STI, while the ordinate represents the yield of product.

By the way, by the term "cone angle" of the polysilicon film 16a, it is meant an angle of the interface between the polysilicon film 16a and the silicon oxide film 44a relative to the interface between the silicon oxide film 15 and the polysilicon film 16a.

As shown in FIG. 10A, when the silicon oxide film 44a was formed into a cross-sectional configuration as shown in FIG. 8B, the cone angle of the polysilicon film 16a was caused to increase, thus correspondingly increasing the percent non-defective resulting from the damage by the STI, i.e. there was a tendency to increase the percent of the damage by the STI. Whereas when the silicon oxide film 44a was formed into a cross-sectional configuration as shown in FIG. 7G, it was possible to realize 100% non-defective with respect to the damage by the STI irrespective of the cone angle of the polysilicon film 16a. Since it is possible, in this manner, to realize a high percent non-defective with respect to the damage by the STI, it becomes possible to prominently improve the yield as shown in FIG. 10B.

As explained above, according to the present invention, the gate electrode is formed so as to have a reverse tapered cross-section. If the gate electrode is formed into such a cross-sectional configuration, there would be little possibility that the patterning of the gate electrode is obstructed by the device isolating insulation film. Therefore, it is possible, according to the present invention, to prevent the generation of short circuit between gate electrodes that might otherwise be induced by the etching residue.

Further, according to the present invention, the device isolating insulation film for filling the groove is deposited in such a way that a first device isolating insulation film is formed inside the groove in a manner to make the groove into a forward tapered configuration in cross-section, and then, a second device isolating insulation film is formed inside the groove so as to fill the groove with the second device isolating insulation film. According to this method, the generation of short circuit between the gate electrodes due to an inappropriate filling of the groove can be prevented.

Namely, according to the present invention, it is now possible to provide an improvement in the STI technique wherein a gate insulation film and a gate electrode material film are successively formed at first and then, a device isolating film is buried, the improvement residing in that the generation of short circuit between the gate electrodes can be effectively prevented. Therefore, according to the present invention, it is now possible to provide a semiconductor device and a manufacturing method thereof, wherein the generation of short circuit between gate electrodes can be substantially prohibited.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:

a semiconductor substrate;

a transistor comprising a gate insulation film on the semiconductor substrate and a gate electrode on the gate insulation film; and a device isolating insulation film formed after formation of at least a portion of the gate electrode and comprising a first portion which extends from a surface of the semiconductor substrate to an inner part of the semiconductor substrate and a second portion which protrudes from the semiconductor substrate, wherein a side surface of the second portion is in direct contact with a side surface of the gate electrode at least partially and a cross section of the gate electrode increases from a bottom surface of the gate electrode facing the semiconductor substrate to a top surface of the gate electrode, and a cross section of the second portion decreases from a bottom surface of the second portion facing the substrate to a top surface of the second portion.

2. The device according to claim 1, wherein the gate electrode constitutes at least a portion of a floating gate electrode, and the transistor further comprising an interlayer gate insulation film on the floating gate electrode and a control gate electrode on the interlayer insulation film.

3. The device according to claim 2, wherein a side surface of the first portion on the gate electrode side is apart from the side surface of the second portion on the gate electrode side and in contact with a bottom surface of the second portion, and a width of the second portion is larger than a width of the first portion.

4. The device according to claim 1, wherein a side surface of the first portion on the gate electrode side is apart from the side surface of the second portion on the gate electrode side and in contact with a bottom surface of the second portion, and a width of the second portion is larger than a width of the first portion.

* * * * *